United States Patent [19]

Kohara et al.

[11] Patent Number: 6,110,821
[45] Date of Patent: Aug. 29, 2000

[54] METHOD FOR FORMING TITANIUM SILICIDE IN SITU

[75] Inventors: Gene Y. Kohara, Fremont; Fusen Chen, Cupertino, both of Calif.; Hyman Joseph Levinstein, Berkeley Heights, N.J.; Zheng Xu, Foster City, Calif.; Peijun Ding, San Jose, Calif.; Gongda Yao; Hong Zhang, both of Fremont, Calif.

[73] Assignee: Applied Materials, Inc., Santa Clara, Calif.

[21] Appl. No.: 09/013,823

[22] Filed: Jan. 27, 1998

[51] Int. Cl.⁷ .................. H01L 21/4763; H01L 21/44
[52] U.S. Cl. ........................................... 438/648; 438/683
[58] Field of Search ..................... 438/683, 648

[56] References Cited

U.S. PATENT DOCUMENTS 5,512,512  4/1996  Isobe .
5,565,382  10/1996  Tseng et al. .
5,635,036  6/1997  Demaray et al. .................. 204/192.12
5,895,266  4/1999  Fu et al. .

*Primary Examiner*—Jey Tsai
*Assistant Examiner*—Josetta Jones
*Attorney, Agent, or Firm*—Birgit E. Morris

[57] ABSTRACT

Titanium is sputtered in an ionized metal plasma sputtering chamber to form titanium silicide in situ in the bottom of openings onto silicon in a series of steps that change the temperature and deposition conditions of sputtering. Ionized titanium is sputtered cold, the temperature is rapidly increased by passing argon through the heated substrate support without sputtering, thereby initiating titanium silicide formation, and then the sputtering of titanium ions is continued at high temperatures to deposit titanium silicide.

To deposit titanium silicide in very high aspect ratio openings, a first layer of titanium atoms is sputter deposited in conventional manner to line the sidewalls of the openings, followed by sputtering from a plasma and continuing with the above process.

12 Claims, 6 Drawing Sheets

METHOD FOR FORMING TITANIUM SILICIDE IN SITU

This invention relates to a new method of forming titanium silicide for semiconductor device contacts. More particularly this invention relates to an in situ method of forming titanium silicide adjacent to a silicon substrate.

BACKGROUND OF THE INVENTION

Contacts to connect devices together to form integrated circuits are generally formed by making openings in the surface of an insulating material disposed between the devices, and depositing a conductive metal, such as aluminum, into the openings and in contact with the devices. However, since aluminum melts at low temperatures, and reacts with the doped silicon which forms the devices, to cause spiking (migration) of the aluminum into the device, a barrier material is generally first deposited in the opening to prevent spiking. Thus a refractory metal and/or compound is used as a barrier layer. Suitable barrier materials include metal and compound layers of titanium, tungsten, tantalum, cobalt and the like. The efficacy of a titanium nitride layer as a barrier material is well known, and is representative of a good barrier material. However, since titanium and titanium nitride are not as conductive as aluminum, heating the substrate to form a more conductive silicide, such as titanium silicide ($TiSi_2$), at the bottom of the opening, is also conventional.

Titanium silicide is generally formed by sputter depositing titanium in a physical vapor deposition (hereinafter PVD) chamber and then transferring the substrate to a rapid thermal anneal (RTA) chamber. The substrate is heated to elevated temperatures, such as between about 500–900° C., to react the titanium with the silicon substrate to form a conductive titanium silicide layer at the substrate. However, this method requires more than one processing chamber and the substrate may be exposed to oxygen and particulates during transfers from one chamber to another. Further, the step coverage in a conventional DC magnetron PVD chamber for small diameter (0.4 micron for example) high aspect ratio (AR>3:1) openings is less than 10%.

Recently, improvements have been made to conventional sputtering chambers that permit the formation of a high density plasma in the chamber. Particles that are sputtered from a target pass through a high density plasma region where they are ionized to form positively charged ions. The substrate, which rests on a biased substrate support, is negatively charged. This causes a more vertical deposition onto the substrate when ions impact the substrate, and improved filling of small diameter, high aspect ratio openings. Step coverage can be increased by about four times in such a chamber.

FIG. 1 is a schematic cross sectional view of such a chamber, known as an ionized metal plasma, or IMP chamber. Referring to FIG. 1, the IMP chamber 170 includes a conventional target 172 mounted on a top wall 173 of the chamber 170. A rotating magnet shown as 176, 178 is mounted over the top of the chamber 173. A substrate support 174, bearing a substrate 175 thereon, is mounted parallel to and spaced from the target 172. A source of DC power 180 is connected to the target 172 and a source of RF power 182 is connected to the substrate support 174. A controller 200 regulates gas flows. A coil 186 is mounted inside the chamber 170 between the target 172 and the substrate support 174, and is connected to a source of RF power 188. Gases in vessels 192, 194 are metered to the chamber by means of flow valves 196, 198.

The pressure in the chamber is maintained by a cryogenic pump 190 through an inlet 191 via a three position gate valve 199. Providing that the pressure in the chamber is fairly high, i.e., about 30–40 millitorr, the internal inductively coupled coil 186 provides a high density plasma in the region between the sputtering cathode or target 172 and the substrate support 174. Thus sputtered target atoms become ionized and positively charged as they pass through the high density plasma region. They are attracted by the negatively biased substrate and thus impact the substrate in a more vertical direction than occurs in conventional PVD chambers. The IMP chamber is generally operated at higher pressures than conventional sputtering chamber, i.e., 30–40 millitorr rather than 1–5 millitorr for conventional sputtering chambers.

Using such a chamber, an in situ deposition of titanium while simultaneously heating the substrate to about 650° C. was tried in order to form titanium silicide in the IMP chamber. An in situ deposition would be advantageous because it eliminates having to transfer the substrate to a separate RTA chamber or separate system, thus reducing the processing time and thus the costs of producing a contact. Further, there is less danger from contamination of the substrate due to additional transfer and handling of the substrate.

A study was performed in the IMP chamber using a blank silicon wafer. The deposition heater temperature for the wafer was set at 550–650° C., DC power was 1 to about 5 kW, RF power to the coil was set at 1–3 kW and the pedestal bias was set at 5–150 volts. The formation of titanium silicide was confirmed.

However, when the study was repeated using a patterned wafer, this attempt was unsuccessful because a void formed in the silicon beneath the silicide. The result is shown in FIG. 2. FIG. 2 is a TEM photograph of an opening in a silicon oxide layer on a silicon substrate partially filled with titanium in an IMP chamber and heated to 650° C. A void in the silicon is clearly seen at 20.

Considering the possibility that contamination on the surface of the silicon substrate caused or contributed to formation of the void, either with native oxide, carbon residues from wet etching, and/or residues from polysilicon or silicon oxide etching, the bottom of the opening was cleaned by both dry and wet etching; however, little improvement was noted, and voids were still formed in the silicon.

However, a method of depositing titanium on a silicon wafer and forming a silicide therefrom in the same chamber has such potential for lowering costs and improving quality, that work has continued to find a method for forming titanium silicide in situ in an IMP chamber without forming voids in the silicon.

SUMMARY OF THE INVENTION

We have found a multi-step deposition of titanium that can form titanium silicide over silicon in situ in an IMP chamber. This method comprises sputtering titanium ions generated in an IMP chamber in a first step at low temperatures, i.e., below the reaction temperature of titanium and silicon, to deposit a layer of titanium on the substrate; rapidly increasing the temperature of the substrate by passing heated argon gas to the backside of the substrate in the absence of sputtering to anneal the substrate and to form an initial titanium silicide layer from the cold deposited titanium layer; and continuing to sputter titanium from titanium ions formed in the plasma region of the IMP chamber at temperatures above the reaction temperature between titanium and silicon, thereby forming titanium silicide in situ. This tri-step process is effective for filling small openings, e.g., having a diameter of 0.4 micron or less and having an aspect ratio (depth to width) up to about 3–4:1, without forming voids.

However, to avoid the formation of voids when smaller openings, e.g., 0.35 micron diameter or less, which have a higher aspect ratio of up to 6–8:1 are to be filled, an additional step is required. Titanium is first conventionally sputtered to coat the sidewalls of the openings with a thin layer of titanium using DC power to the target alone. Then, with the RF power to the coil on to form a high density plasma and thus ionize the target material, a low temperature deposition of titanium from titanium ions follows; the temperature is then increased to cause a reaction between the titanium and the underlying silicon. Sputtering of titanium at high temperatures deposits titanium ions on the silicon substrate, forming titanium silicide simultaneously. This process has been found to form titanium silicide while preventing the formation of voids even in high aspect ratio openings.

After sputtering is stopped, the substrate can continue to be heated if desired to ensure that all free titanium has been reacted, and to eliminate non-uniformities at the titanium-silicon interface.

DETAILED DESCRIPTION OF THE INVENTION

Figure 3:
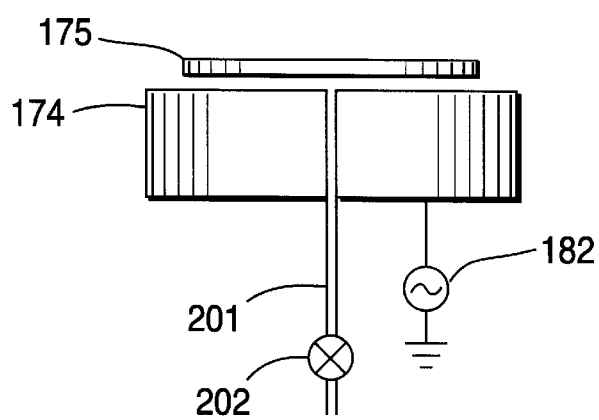
FIG. 3 is a cross sectional view of a modified substrate support for the IMP chamber.
Figure 2:
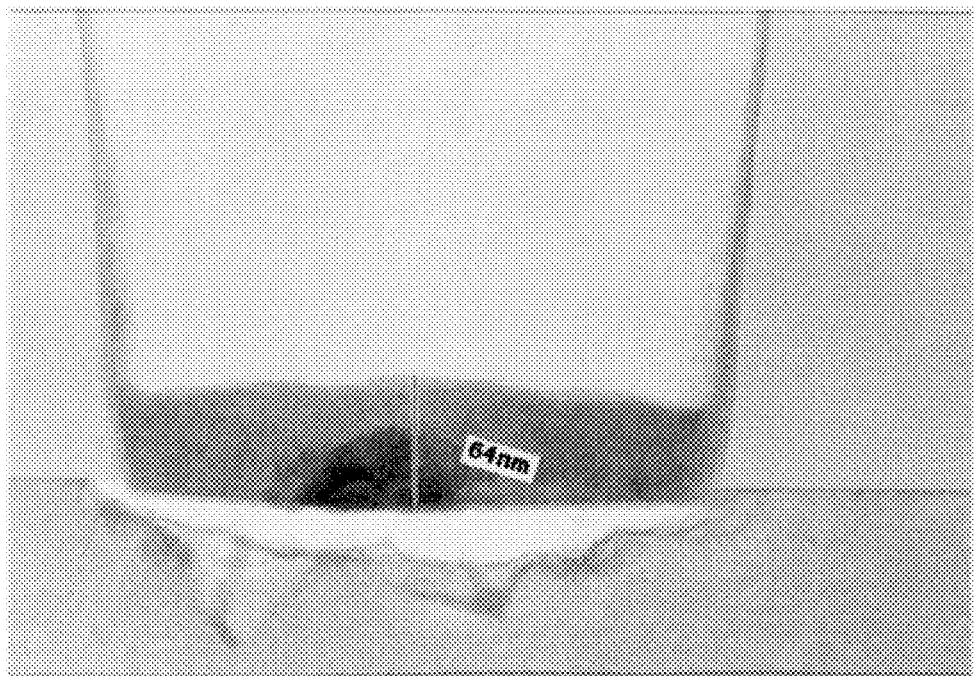
FIG. 2 is a TEM photograph of an opening partially filled with titanium silicide in accordance with a method of the prior art.

In order to carry out the titanium depositions herein while varying the temperature of the substrate, the substrate support, which is heated by a resistance heater to the desired temperature, such as 450–750° C., is additionally fitted with an argon gas feed. Referring to FIG. 3, an argon gas feed 201 is passed through the substrate support 174 and is metered using a gas flow valve 202. When no argon is fed to the substrate support 174, the substrate 175 is radiantly heated from the heated substrate support 174. At low vacuum there are few gas molecules to aid in transferring heat from the substrate support 174 to the substrate 175, and thus heating of the substrate 175 is inefficient and non-uniform. The result is that the substrate 175 remains at much lower temperatures than the substrate support 174.

However, when argon gas is passed through the heated substrate support 174 and passed to the backside of the substrate 175, the heated argon gas fills the space between the substrate 175 and the substrate support 174 and rapidly heats the substrate 175 to near the temperature of the substrate support 174.

Thus the first, "warm" titanium deposition step, is carried out with the DC bias to the substrate and RF power to the coil on, but without passing heated argon gas to the backside of the substrate. Since the temperature of the substrate remains at a temperature below the reaction temperature of titanium and silicon, titanium silicide is not formed during this initial titanium deposition. However, since titanium is a good getter for oxygen in particular, and other contaminants that may be on the surface of the silicon, any surface contaminants are gettered by titanium during this step. About one-half of the desired titanium thickness may be deposited in this step.

The power to the target 172 is then shut off, thus terminating titanium deposition, and an argon gas flow to the backside of the substrate is then started. The argon gas flow efficiently heats the substrate by filling the gap between the substrate and its support which rapidly heats the substrate up to the temperature of the substrate support. For example, a 15 sccm flow of argon to the backside of the substrate for about 60 seconds raises its temperature from about 350° C. to about 560° C. Thus during this annealing step, the substrate is heated to the approximate temperature of the substrate support, and a reaction between the already deposited titanium layer and the silicon substrate is initiated. Since the temperature of the substrate is now higher, contaminants such as $TiO_x$ are less stable and any volatile contaminants are removed.

In a next step, while maintaining the elevated temperature of the substrate, power to the target and to the coil is turned on and direct sputtering of titanium is continued at high temperatures. Titanium silicide continues to form now as more titanium is deposited on the substrate at temperatures above the reaction temperature between titanium and silicon. The use of RF bias to the substrate ensures good bottom coverage of the openings with the titanium silicide, by attracting the ionized target particles toward the substrate. Sputtering is continued until the desired thickness of titanium silicide is formed.

Optionally, with the power to the target turned off, the substrate heating or annealing can be continued to ensure that all of the deposited titanium has reacted with silicon.

The above process produces titanium silicide in situ without voids, and without the need to transfer the substrate to a separate annealing chamber.

Although the invention is not meant to be limited to a particular theory or mechanism, it is believed that voids form beneath openings in silicon partly filled with titanium in the prior art processes because silicon, rather than reacting with titanium, first diffuses into the titanium layer, leaving a space where the silicon was. Further, when titanium ions are formed in the plasma, they can cause contaminants in the chamber and on the substrate to deposit on the bottom of the opening. These contaminants cause non-uniform silicon diffusion in the substrate, and silicon is consumed at different rates at different locales, causing roughness and the formation of voids.

However, we have also found that the steps described above in accordance with the invention are not always effective to eliminate the formation of voids in silicon when very high aspect ratio openings, of 6–8:1 for example, are to be partially filled with titanium.

When high aspect ratio openings are to be partially filled with titanium, an additional first step is required. A first cold conventional titanium sputter deposition is carried out that coats the opening sidewalls with titanium atoms. Still at low temperatures, in a second step, titanium is sputtered through a high density plasma to form positively charged titanium ions that deposit on the bottom of the openings below the reaction temperature of titanium and silicon. Thirdly, the substrate is then rapidly heated using a hot backside argon gas flow which heats the substrate to about 560–580° C., above the reaction temperature between titanium and silicon, initiating the formation of titanium silicide. Fourthly, sputtering is continued at elevated temperatures using a heated backside argon flow to the substrate to form a titanium silicide layer on the substrate.

The success of this method is explainable as follows: it is believed that during high temperature sputtering with a bias on the substrate, re-sputtering of the material off the sidewalls of the opening occurs. If the sidewalls are made of silicon oxide for example, re-sputtering of the sidewalls causes a large amount of oxygen impurity to deposit on the bottom of the openings. If titanium silicide is not yet formed, i.e., the titanium is deposited below the reaction temperature between titanium and silicon, the oxygen reacts with the silicon substrate instead, forming silicon oxide. Since silicon oxide is a dielectric, a good contact cannot be made thereover. If non-ionized titanium ions are deposited cold on the opening sidewalls first, so as to coat or line the sidewalls of the openings with titanium, any silicon oxide along the sidewalls becomes covered over and any re-sputtering of the sidewalls will sputter titanium rather than oxide onto the bottom of the openings.

Other materials can be substituted for titanium to line the sidewalls, such as titanium nitride, as desired. What is important is that silicon oxide or other sidewall material that will contaminate the titanium-silicon interface be covered over before a process environment which will re-sputter the sidewalls is applied to the substrate.

Thus in accordance with the second deposition method, non-ionized titanium is deposited first to line the opening; then a layer of ionized titanium is deposited to build up titanium on the bottom of the opening, taking up or gettering any oxygen at the bottom of the opening; both initial steps occur with a substrate temperature below the Ti—Si reaction temperature. Then the substrate is heated by passing heated argon gas to the backside of the support to begin a reaction between titanium and silicon. At this stage, gettered contaminants are heated and become less stable and more volatile. Sputtering and formation of titanium ions are continued at elevated temperatures using backside substrate heating with argon in the presence of a high density plasma to deposit titanium which then forms titanium silicide. Heating of the substrate can be continued without deposition to ensure that all of the titanium has been converted to titanium silicide.

The invention will be further explained by means of the following examples and controls, but the invention is not meant to be limited to the details described therein.

Control 1

Figure 1:
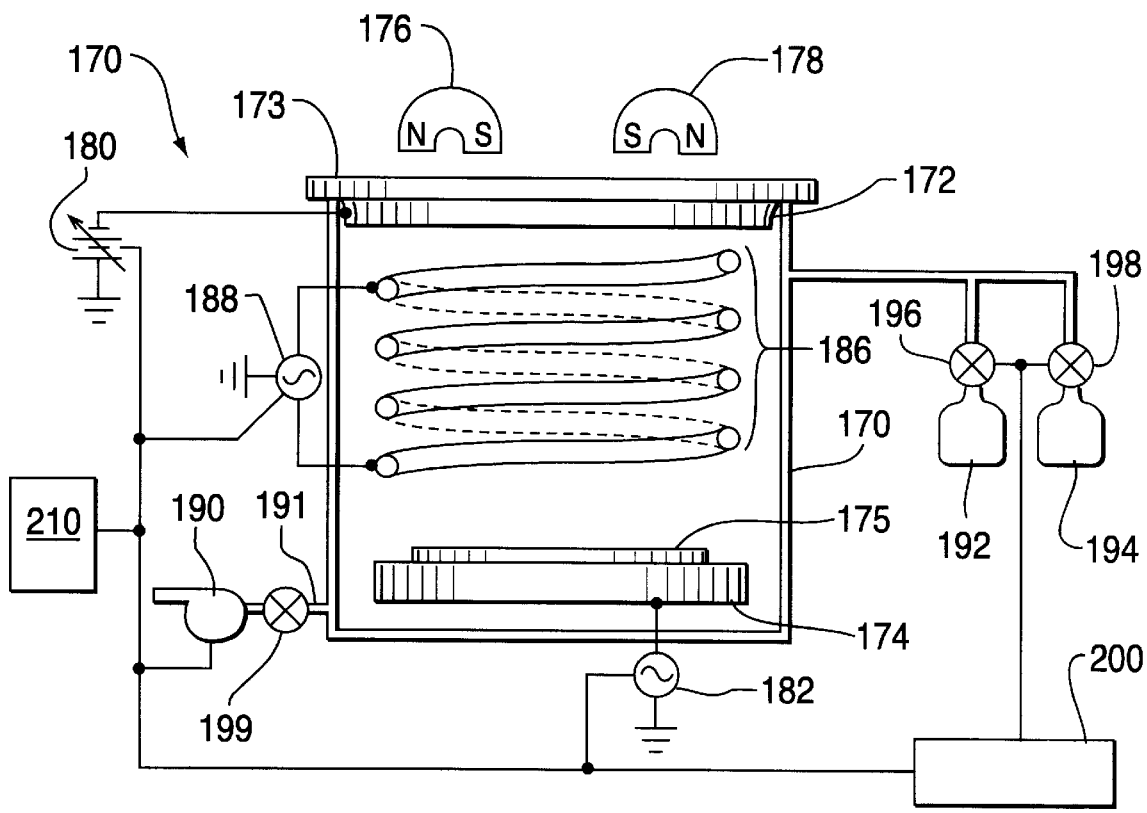
FIG. 1 is a schematic cross sectional view of an IMP chamber.

In an IMP chamber as in FIG. 1, a layer of titanium about 500 Å thick was deposited in a slightly tapered opening having a diameter of 0.31 micron at the bottom of the opening and a depth of 1.4 microns (AR 4.5:1) by preheating the substrate for 90 seconds at 650° C., applying 4.0 kW of power to the target, 3.0 kW to the coil with 120 watts to the wafer support, maintaining a pressure of 37 millitorr in the chamber. The reaction was continued for 50 seconds (deposition rate 600 Å/minute).

Figure 4:
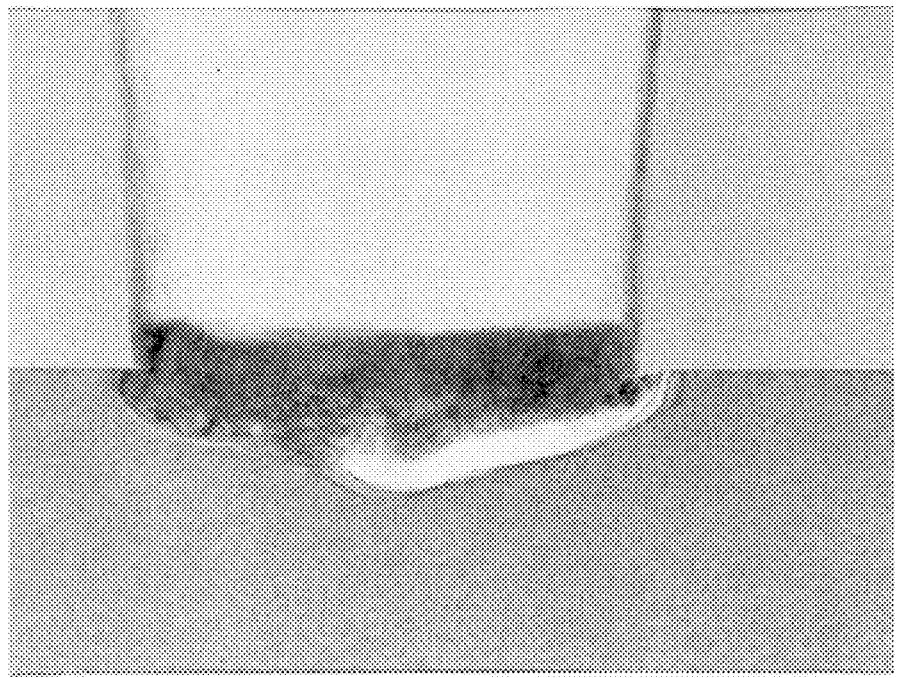
FIG. 4 is a TEM photograph of an opening partially filled with titanium silicide but not in accordance with the invention.

The resultant layer was examined by TEM. A large void formed beneath the titanium silicide layer, as can be seen in FIG. 4 at 42.

EXAMPLE 1

In an IMP chamber as shown in FIGS. 1 and 3, after loading the substrate onto the substrate support, it was allowed to come to operating pressure for 10 seconds, without using an argon backside gas flow. The substrate included a plurality of openings having an aspect ratio of about 3:1 to 4:1. Titanium sputtering was initiated at a comparatively low temperature of the substrate (without argon backside gas) for 15 seconds using 4.0 kW of power to the target, 3.0 kW of power to the coil and 120 watts of power to the substrate support at a pressure of 37 millitorr to deposit 150 Å of titanium. Then a flow of argon gas was started and passed to the backside of the substrate for 45 seconds to initiate a reaction between the titanium and the silicon substrate. While continuing to heat the substrate, titanium was sputtered for 15 seconds more under the original power and pressure settings to deposit titanium and convert it to titanium silicide.

Figure 5:
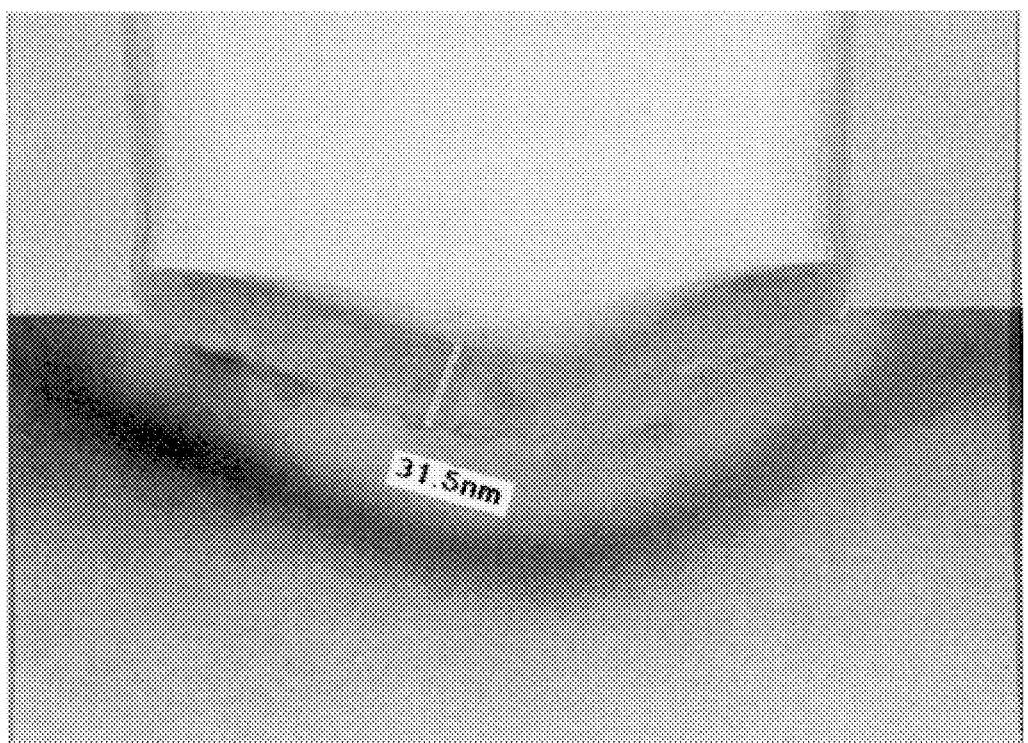
FIG. 5 is a TEM photograph of an opening partially filled with titanium silicide in accordance with the present process.

Examination of the opening by TEM showed that no void had formed beneath the opening, as shown in FIG. 5.

Control 2

Figure 6:
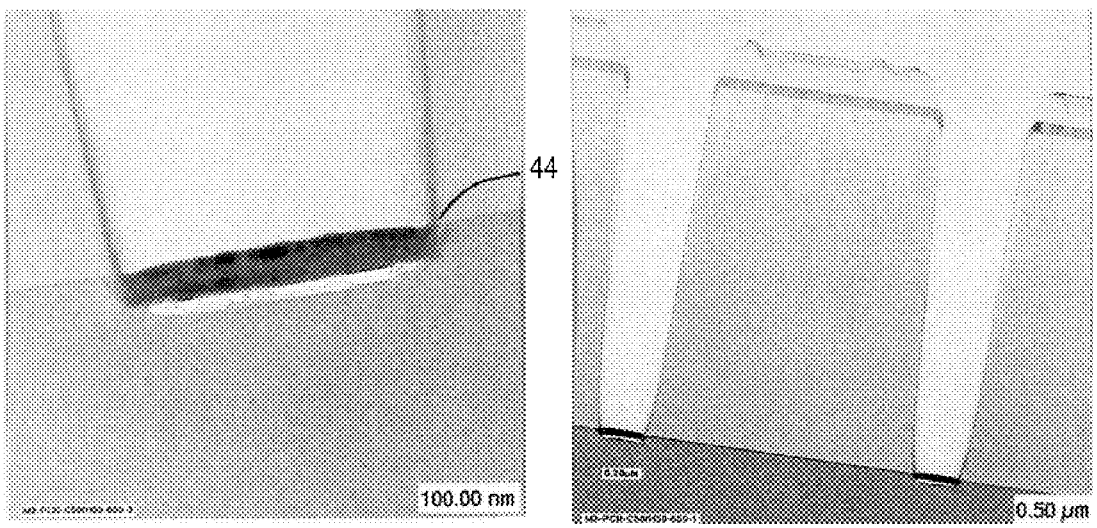
FIG. 6 is a TEM photograph of a high aspect ratio opening partially filled with titanium.

A substrate including openings 0.35 micron in diameter and 2.4 microns deep (AR 8:1) was partially filled with titanium following the procedure of Example 1. A void formed in the silicon substrate beneath the openings as shown in FIG. 6 at 44.

EXAMPLE 2

This process can be used for high aspect ratio openings, e.g., above about 4:1, when the sidewalls of the openings must be lined to prevent contamination of the substrate in the event of re-sputtering.

Figure 7:
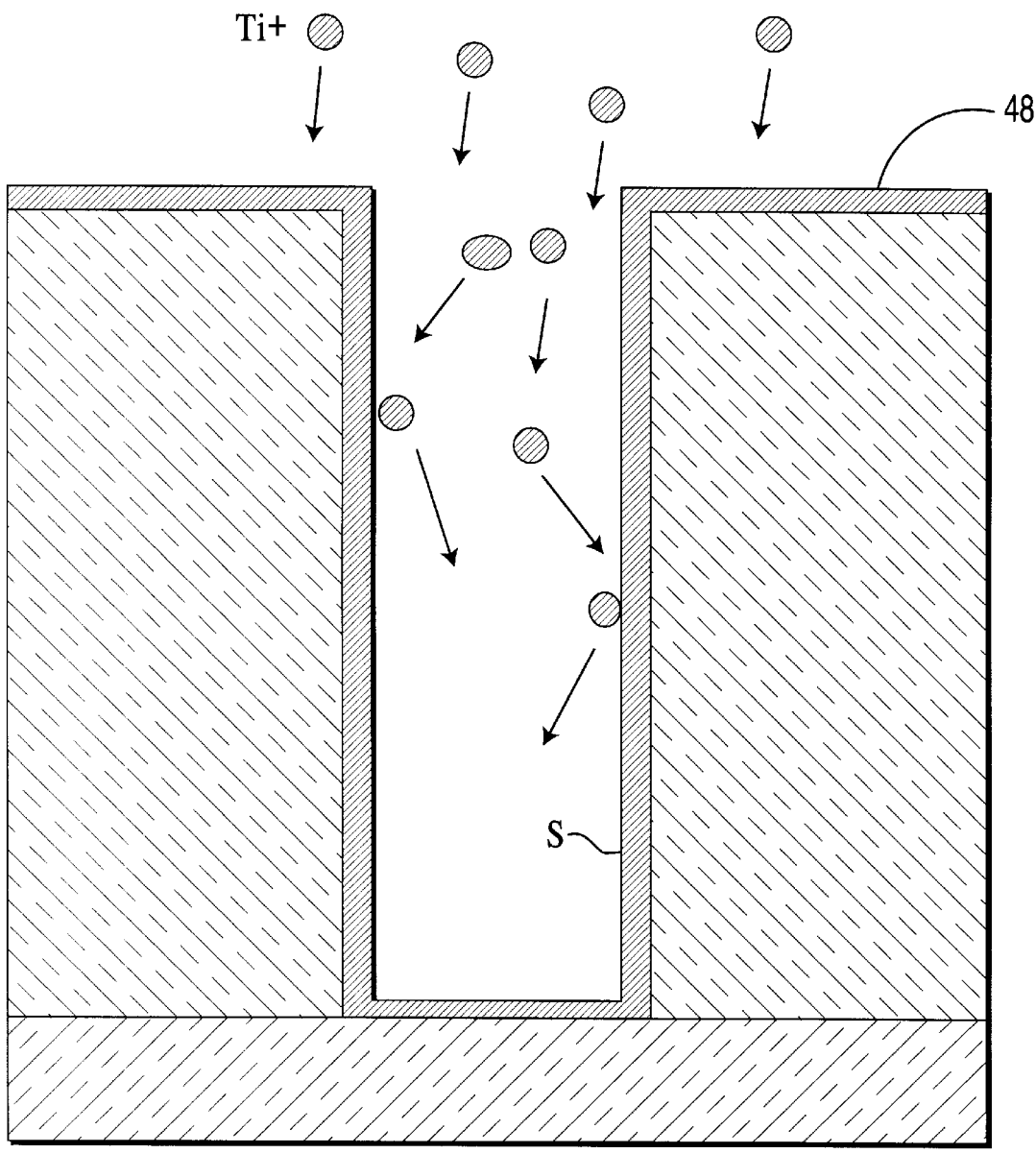
FIG. 7 is a schematic view of an opening lined with titanium metal.

Titanium was sputtered in an IMP chamber of FIGS. 1 and 3 onto a substrate having an AR of 8:1 without using backside argon gas, without applying power to the coil and without applying a bias to the substrate support. A thin coating 48 of titanium (from 25 to about 100 Å) was deposited to line the openings, as shown in FIG. 7. Sputtering of titanium was continued with RF power to the coil and bias to the pedestal, but without backside argon gas flow, to cover the bottom of the openings with a layer of titanium. The backside argon gas flow was turned on to heat the substrate to a temperature of about 580° C. and initiate a reaction between the titanium and the silicon substrate. Sputtering of titanium ions was continued while heating with backside argon gas until the desired titanium silicide layer thickness was obtained.

Figure 8:
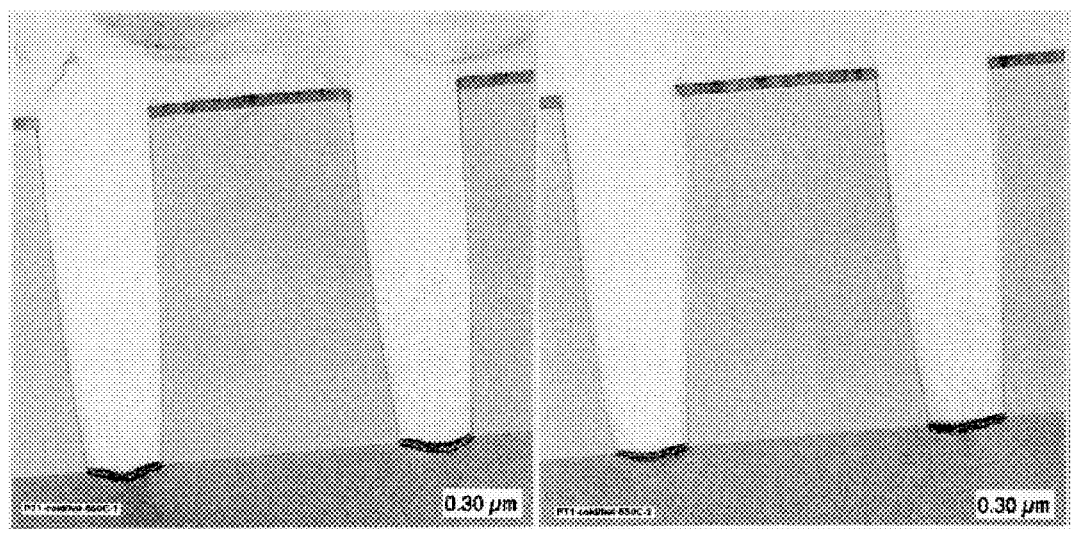
FIG. 8 is a TEM photograph of a high aspect ratio opening filled in accordance with a second embodiment of the present process.

Examination of the openings by TEM showed that no void formed beneath the openings in the silicon, as shown in FIG. 8.

A controller, such as a programmed computer 210, can be connected to the sputtering chamber 170 and can be programmed so as to control the process of the invention automatically, including turning the power supplies on and off, starting and stopping the various gas flows and adjusting the gas flow rates, transferring a substrate into and out of the sputtering chamber 170 and the like.

Although the invention has been described in terms of specific embodiments, one skilled in the art will recognize that various changes to the reaction conditions, i.e., temperatures, pressure, film thicknesses and the like can be substituted and are meant to be included herein. In addition, another barrier metal can be substituted for titanium and deposited on the opening sidewalls, although that will require a separate target. Thus the invention is only meant to be limited by the scope of the appended claims.

We claim:

1. A method for forming a refractory metal silicide in the bottom of an opening adjacent to a layer of silicon in situ comprising
    a) providing a sputtering chamber having a target of a silicide-forming metal material, a coil mounted between the target and a heated biased substrate support having a gas line therethrough;
    b) sputtering a metal material from the target while maintaining power to the coil;
    c) shutting off the power to the target and passing a gas through the substrate support to the backside of the substrate; and
    d) powering the target and the coil and continuing to sputter deposit the metal material while passing the gas to the backside of the substrate to heat the substrate above the reaction temperature between the metal material and silicon to form a metal silicide in situ.

2. A method according to claim 1 wherein the substrate has contact openings on a surface thereof.

3. A method according to claim 1 wherein the substrate support is heated in step d) to between about 450 and 750° C. to provide simultaneous sputtering and annealing of the metal material.

4. A method according to claim 1 wherein the substrate is annealed while flowing argon to the backside of the substrate.

5. A method according to claim 1 wherein the aspect ratio of the contact opening is up to about 4:1.

6. A method according to claim 1 wherein the metal material is sputtered without powering the coil prior to step b) to line the opening with the metal material.

7. A method according to claim 1 wherein the metal material is titanium.

8. A method according to claim 6 wherein the metal material is titanium.

9. A method according to claim 6 wherein the aspect ratio of the opening is above about 4:1.

10. A method according to claim 6 wherein the substrate support is heated to a temperature between about 450 to 750° C.

11. A method for forming a refractory metal silicide in the bottom of an opening adjacent to a layer of silicon in situ comprising
    a) providing a sputtering chamber having a target of a silicide-forming metal material and a means of forming a high density plasma in said chamber between the target and a heated biased substrate support having an argon gas line therethrough;
    b) sputtering a metal material from the target while maintaining said plasma;
    c) shutting off the power to the target and passing argon gas through the substrate support to the backside of the substrate, thereby rapidly elevating the temperature of the substrate;
    d) connecting the target and the means of forming the plasma to a source of power and continuing to sputter deposit the metal material while passing argon to the backside of the substrate to heat the substrate above the reaction temperature between the metal material and silicon to form a metal silicide in situ.

12. A method of forming a metal silicide over a silicon substrate without forming a void in the substrate comprising:
    a) sputter depositing a metal target material onto the substrate in a sputtering chamber;
    b) passing a heated gas to the backside of the substrate above the temperature of reaction between the metal and the silicon to form an initial layer of a silicide of the metal on the substrate; and
    c) continuing to sputter the metal material in the presence of a plasma in the chamber above the temperature of reaction between the metal material and the silicon to form a metal silicide in situ.

* * * * *